United States Patent
Fujishiro et al.

(10) Patent No.: US 7,869,289 B2
(45) Date of Patent: Jan. 11, 2011

(54) SEMICONDUCTOR DEVICE HAVING TRANSMISSION CONTROL CIRCUIT

(75) Inventors: Keisuke Fujishiro, Chuo-ku (JP); Hideaki Kato, Kodaira (JP)

(73) Assignee: Elpida Memory, Inc., Tokyo (JP)

( * ) Notice: Subject to any disclaimer, the term of this patent is extended or adjusted under 35 U.S.C. 154(b) by 152 days.

(21) Appl. No.: 12/367,986

(22) Filed: Feb. 9, 2009

(65) Prior Publication Data
US 2009/0201754 A1 Aug. 13, 2009

(30) Foreign Application Priority Data
Feb. 12, 2008 (JP) .............................. 2008-031103

(51) Int. Cl.
*G11C 7/00* (2006.01)
(52) U.S. Cl. .................. 365/200; 365/185.09; 365/226; 365/233
(58) Field of Classification Search ................. 365/200, 365/185.09, 226, 233
See application file for complete search history.

(56) References Cited

U.S. PATENT DOCUMENTS 7,456,668 B2 * 11/2008 Nakanishi et al. ............ 327/176
2002/0008586 A1 * 1/2002 Nakamichi .................... 331/16
2005/0286324 A1   12/2005 Arakawa
2010/0213967 A1 * 8/2010 Negishi ...................... 324/765

FOREIGN PATENT DOCUMENTS

JP    2006-012229 A    1/2006

* cited by examiner

*Primary Examiner*—Connie C Yoha
(74) *Attorney, Agent, or Firm*—Sughrue Mion, PLLC (57) ABSTRACT

A semiconductor device has a transmission control circuit comprising a signal transmission circuit, an output control circuit, a replica circuit and a detection circuit. The single transmission circuit receives a predetermined signal in synchronization with a first control signal, and transmits and outputs the signal through a signal bus in synchronization with a second control signal. The output control circuit supplies the second control signal and controls an output timing thereof. The replica circuit transmits and outputs a replica signal (having level shifted in response to the input timing of the predetermined signal) through a replica signal bus having the same transmission characteristics as the signal bus. The detection circuit detects shifting of the replica signal and supplies a feedback signal to the output control circuit whose output timing is controlled in accordance with the shifting timing of the replica signal based on the feedback signal.

20 Claims, 8 Drawing Sheets

SEMICONDUCTOR DEVICE HAVING TRANSMISSION CONTROL CIRCUIT

BACKGROUND OF THE INVENTION

1. Field of the Invention

The present invention relates to a semiconductor device having a transmission control circuit in which a signal transmission circuit for transmitting a predetermined signal through a signal bus is provided, and particularly relates to a semiconductor device having a transmission control circuit which is configured to perform timing control using a replica circuit when transmitting the predetermined signal through the signal bus.

2. Description of Related Art

A semiconductor memory device such as a DRAM (Dynamic Random Access Memory) is generally provided with a transmission control circuit for controlling a transmission timing of a signal. Since an increase in capacity of the semiconductor memory device poses a problem of delay in a signal bus for transmitting signals, it is important to properly adjust delay time of a control signal for defining an operation timing of the transmission control circuit so as to obtain sufficient margin for a signal having large transmission delay. However, when device characteristics and temperature characteristics of the semiconductor device fluctuate for the operation timing based on the adjusted delay time, the margin often becomes improper due to an increase or decrease in the transmission delay. That is, when the transmission delay of the signal bus decreases relative to the above operation timing, the proper transmission characteristics cannot be obtained due to over-margin, while when the transmission delay of the signal bus increases relative to the above operation timing, insufficiency of the margin causes that proper operation is not assured, so that there is an concern of an increase in failures.

In a read operation of the DRAM, for example, when read data of a memory cell array is transmitted through the signal bus and outputted, its output term is controlled by a pulse of a control signal for which a proper delay time is set. At this point, since the operation timing of the transmission control circuit and the transmission timing of the signal bus are not identical to each other due to fluctuations in device characteristics and temperature characteristics, the output of the read data transmitted during the output term set by the control signal is hindered and there is a possibility that failures in the DRAM increase.

Meanwhile, a configuration including a replica circuit having the same characteristics as a certain circuit has been conventionally proposed (see, for example, Laid-open Japanese Patent Publication No. 2006-12229). Thus, the above transmission control circuit can be provided with the replica circuit. However, since the conventional replica circuit operates to replace a function of the certain circuit, it is difficult to improve timing control itself of the transmission control circuit and a technique for solving the above problem has not been proposed.

SUMMARY

The present invention seeks to solve the above problem and provides a semiconductor device in which an output timing is properly controlled for a delay when transmitting a predetermined signal through a signal bus in a situation where device characteristics and temperature characteristics fluctuate, thereby achieving higher-speed transmission and preventing a failure occurring due to insufficient margin of the output timing.

In one of aspects of the invention, there is provided a semiconductor device comprising a transmission control circuit, said transmission control circuit comprising: a signal transmission circuit for receiving a predetermined signal in synchronization with a first control signal, transmitting said predetermined signal through a signal bus, and outputting said predetermined signal in synchronization with a second control signal; an output control circuit for supplying said second control signal to said signal transmission circuit and controlling an output timing at which said predetermined signal is outputted from said signal bus; a replica circuit for transmitting and outputting a replica signal through a replica signal bus having same transmission characteristics as said signal bus, said replica signal being shifted in level in response to an input timing of said predetermined signal based on said first control signal; and a detection circuit for detecting shifting between high and low levels of said replica signal outputted from said replica circuit, and supplying a feedback signal indicating a detection result to said output control circuit. In the semiconductor device, the output timing of said output control circuit is controlled in accordance with a timing at which the shifting of said replica signal is detected in said feedback signal.

According to the aspects of the invention, the replica circuit is provided in addition to the signal transmission circuit for transmitting the predetermined signal through the signal bus, the same transmission characteristics of both the circuits is maintained, shifting of the replica signal changing in response to the input timing of the predetermined signal is detected by the detection circuit and fed back to the output control circuit, and thereby controlling the output timing of the predetermined signal. Thus, when transmitting the predetermined signal, the output timing can be appropriately controlled by the function of the replica circuit even if delay time of a control signal is increased or decreased due to fluctuations in device characteristics and temperature characteristics. Accordingly, an increase in failures caused by insufficiency of margin for the output timing in the transmission control circuit can be prevented, and high-speed transmission can be obtained by avoiding over-margin.

In another aspect of the invention, there is provided a semiconductor device comprising: a signal transmission circuit including a signal bus, an input circuit for said signal bus, and an output circuit for said signal bus; a replica signal bus having same transmission characteristics as said signal bus; said replica signal being shifted in level in response to an input timing of said predetermined signal based on said first control signal; and a replica circuit for including said replica signal bus, an input circuit for said replica signal bus, and an output circuit for said replica signal bus. In the semiconductor device, a predetermined signal is transmitted through said signal bus and a replica signal is transmitted through said replica signal bus, said replica circuit receives said replica signal and outputs a feedback signal, and the output circuit of said signal transmission circuit controls transmission of the signal through said signal bus in accordance with a second control signal generated from said feedback signal.

As described above, according to the present invention, when transmitting the predetermined signal using the transmission control circuit, since the replica circuit is provided together with the signal transmission circuit and the output timing of the signal transmission circuit is appropriately controlled by feeding back the shifting of the replica signal, a control can be performed so as to automatically follow a fluctuation in the operation timing in the signal transmission circuit. That is, when the delay of a control signal in the transmission control circuit is fluctuated due to fluctuations in device characteristics and temperature characteristics, the output timing of the predetermined signal can be appropriately controlled along a time axis in response to the fluctuation. Thus, when transmitting the predetermined signal, occurrence of a failure due to insufficiency of margin can be prevented, and a decrease in transmission speed due to over-margin can be avoided, thereby achieving the transmission control circuit having high performance and high reliability.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, a case where a DRAM as a semiconductor device is configured to include a transmission control circuit to which the present invention is applied will be described as one of the embodiments.

Figure 1:
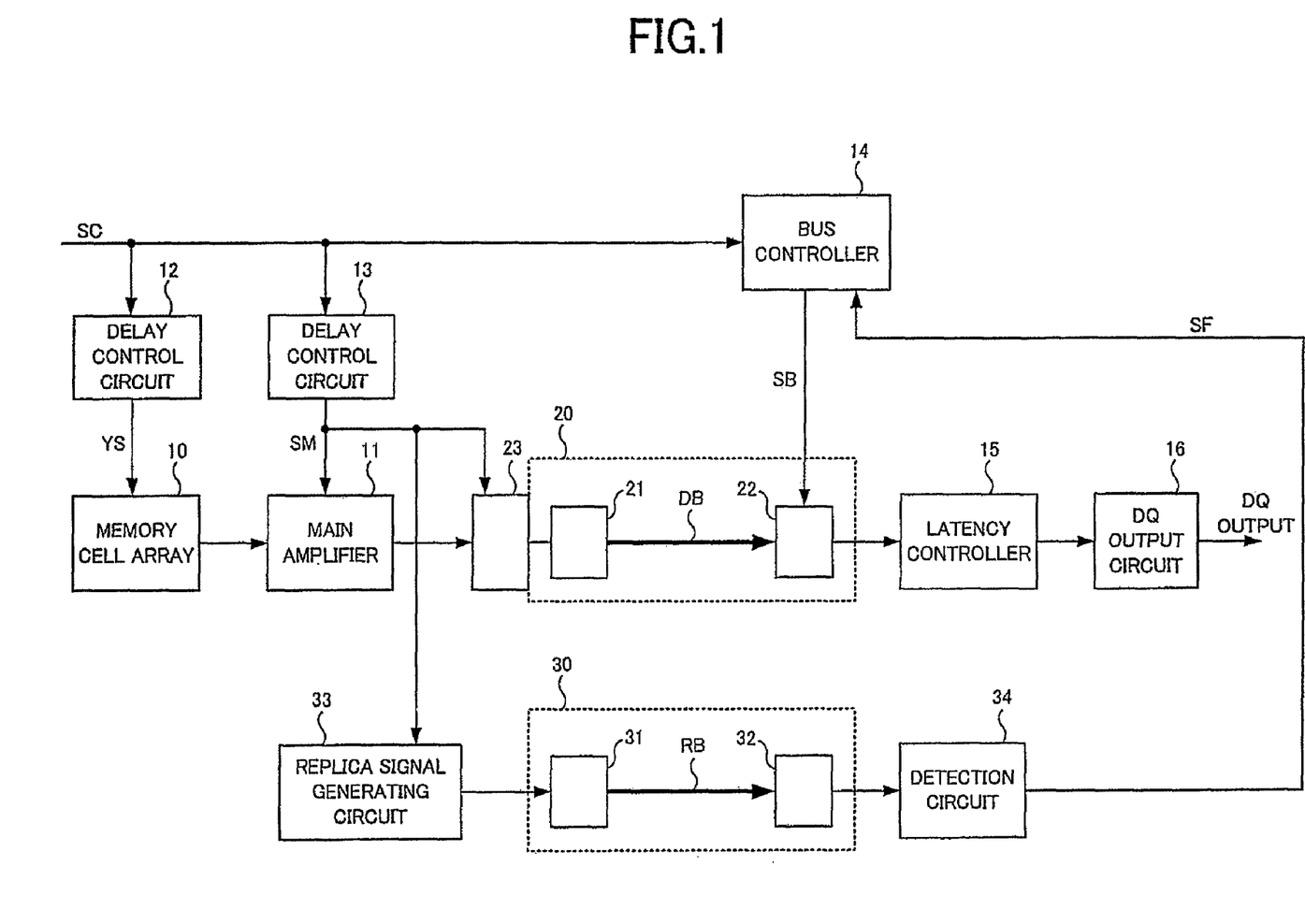
FIG. 1 is a block diagram showing a principal configuration of a DRAM of an embodiment of the present invention.

FIG. 1 is a block diagram showing a principal configuration of the DRAM configured to include the transmission control circuit of the present invention. In FIG. 1, there are shown a circuit block relating to read operation of the DRAM, which includes a memory cell array 10, a main amplifier 11, delay control circuits 12 and 13, a bus controller 14, a latency controller 15, a DQ output circuit 16, a data bus circuit 20 configured with a data bus DB between a driver 21 and an output buffer 22, an input circuit 23, a replica circuit 30 configured with a replica data bus RB between a driver 31 and an output buffer 32, a replica signal generating circuit 33, and a detection circuit 34.

In the above configuration, the memory cell array 10 includes a large number of memory cells for storing data, and is capable of accessing an arbitrary memory cell corresponding to a designated address. The main amplifier 11 amplifies and outputs data which has been read in the read operation. The read operation for the memory cell array 10 is controlled by a read control signal SC supplied from a control circuit (not shown). As shown in FIG. 1, the timing of the read control signal SC is adjusted by the delay control circuits 12 and 13, a column selection signal YS (the decode signal of the invention) outputted from the delay control circuit 12 is supplied to the memory cell array 10, and a main amplifier driving signal SM (the first control signal of the invention) outputted from the delay control circuit 13 is supplied to the main amplifier 11.

The data bus circuit 20 (the signal transmission circuit of the invention) receives read data (the predetermined signal of the invention) from the main amplifier 11 through the input circuit 23 in response to the main amplifier driving signal SM. The read data is driven by the driver 21 (the drive circuit of the invention) and transmitted through the data bus DB (the signal bus of the invention). Then, the read data is outputted from the output buffer 22 at an output timing controlled based on a later-described output control signal SB (the second control signal of the invention). In addition, configurations of the input circuit 23, the driver 21 and the output buffer 22 will be described below. The read data outputted from the data bus circuit 20 is transferred to the DQ output circuit 16 in accordance with a timing controlled by the latency controller 15, and outputted to outside as a DQ output.

Meanwhile, the replica circuit 30 has a configuration common to the data bus circuit 20, and includes the driver 31 corresponding to the above driver 21, the replica data bus RB (the replica signal bus of the invention) corresponding to the above data bus DB, and the output buffer 32 corresponding to the above output buffer 22. The replica signal generating circuit 33 provided on the input of the replica circuit 30 generates a replica signal whose level is shifted in response to the main amplifier driving signal SM. The replica signal from the replica signal generating circuit 33 is driven by the driver 31 and transmitted through the replica data bus RB, and outputted from the output buffer 32. In addition, configurations of the replica signal generating circuit 33, the driver 31 and the output buffer 32 will be described below.

Here, the replica data bus RB needs to have the same transmission characteristics as the data bus DB, therefore they have basically the same wiring shape and line length, and characteristics such as floating capacitance are common between the replica data bus RB and the data bus DB. Further, they have the same configurations of the drivers 21, 31 and the output buffers 22, 32 so that transmission delay thereof is matched, and also the time required for the transmitted signal to be shifted between high and low levels, for example, is almost matched.

In FIG. 1, the detection circuit 34 receives the replica signal outputted through the replica circuit 30 and detects shifting of the level thereof. The detection circuit 34 outputs a feedback signal SF having a pulse corresponding to the detection result. As shown in FIG. 1, the feedback signal SF of the detection circuit 34 is supplied to the bus controller 14 (the output control circuit of the invention), and the output control signal SB changing based on the feedback signal SF is generated by the bus controller 14. That is, the output timing of the read data in the data bus circuit 20 reflects transmission operation of the replica circuit 30.

Figure 2:
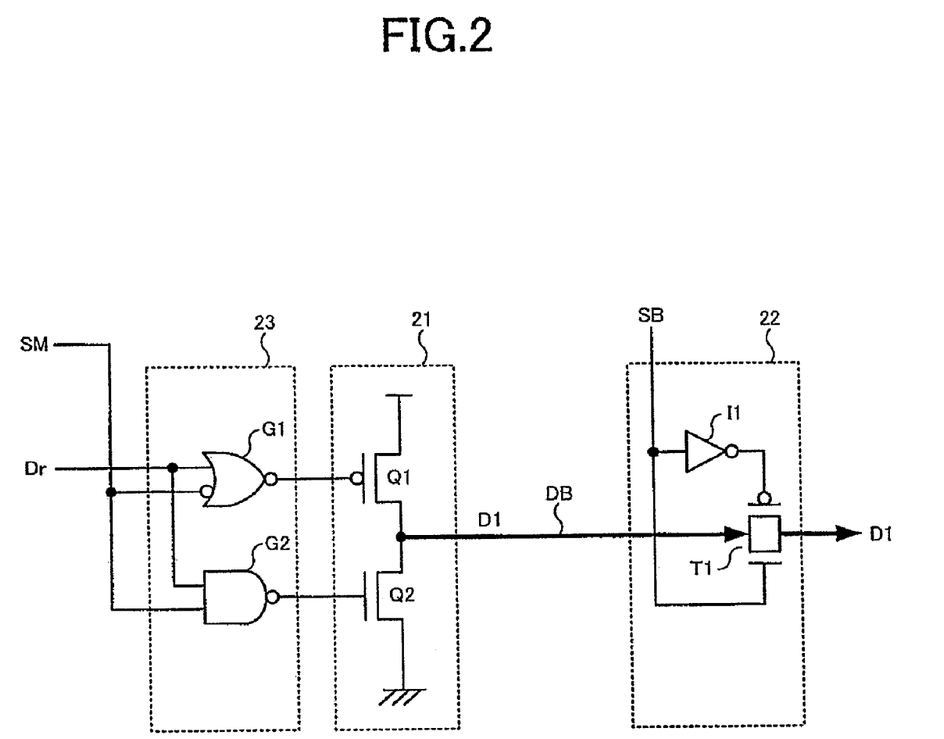
FIG. 2 is a diagram showing a circuit configuration example of a portion including a data bus circuit 20 and an input circuit 23 of FIG. 1.

Next, specific circuit configurations of major elements in the principal configuration shown in FIG. 1 will be described with reference to FIGS. 2 to 4. FIG. 2 shows a circuit configuration example of a portion including the data bus circuit

20 and the input circuit 23 of FIG. 1. As shown in FIG. 2, the input circuit 23 is composed of a NOR gate G1 and a NAND gate G2. Read data Dr is inputted to one input terminal of the NOR gate G1, and an inverted signal of the main amplifier driving signal SM is inputted to the other input terminal of the NOR gate G1. The read data Dr is inputted to one input terminal of the NAND gate G2, and the main amplifier driving signal SM is inputted to the other input terminal of the NAND gate G2.

The driver 21 is composed of a P-type MOS transistor Q1 and an N-type MOS transistor Q2 connected in series between a power supply and ground. An inverted signal of the output of the NOR gate G1 gate is coupled to the gate of the MOS transistor Q1, and the output of the NAND gate G2 gate is coupled to the gate of the MOS transistor Q2. A node between the MOS transistors Q1 and Q2 is connected to an input of the data bus DB. By this connection, when the main amplifier driving signal SM is "1", the two MOS transistors Q1 and Q2 are switched on/off in response to the level of the read data Dr, and read data D1 corresponding to the input read data Dr is transmitted through the data bus DB. On the other hand, when the main amplifier driving signal SM 0 is "0", the MOS transistor Q1 is fixed to off and the MOS transistor Q2 is fixed to on, and therefore the data bus DB is always maintained high and the read data Dr is not transmitted.

The output buffer 22 is composed of a transfer gate T1 and an inverter I1 which are connected to an output of the data bus DB. The output control signal SB and an inverted signal thereof through the inverter I1 are coupled to two control terminals of the transfer gate T1, thereby controlling an conductive state of the transfer gate T1. When the output control signal SB is "0", the transfer gate T1 is in a non-conductive state so that the read data D1 transmitted through the data bus DB is not outputted. On the other hand, when the output control signal SB is "1", the transfer gate T1 is in a conductive state, so that the read data D1 transmitted through the data bus DB is outputted to the latency controller 15.

Figure 3:
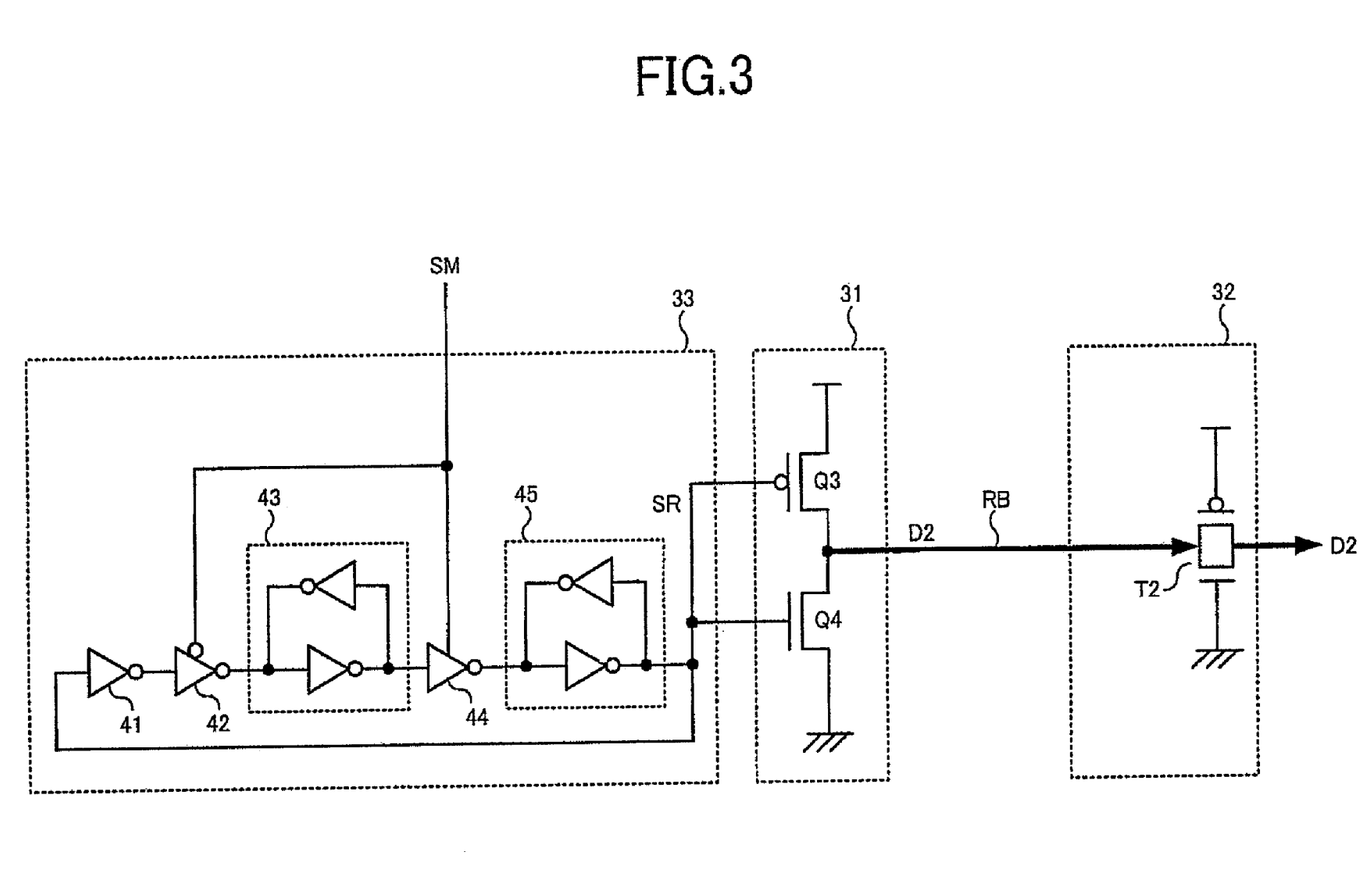
FIG. 3 is a diagram showing a circuit configuration example of a portion including a replica circuit 30 and a replica signal generating circuit 33 of FIG. 1.

Next, FIG. 3 shows a circuit configuration example of a portion including the replica circuit 30 and the replica signal generating circuit 33 of FIG. 1. As shown in FIG. 3, the replica signal generating circuit 33 is configured so that an inverter 41, tri-state inverters 42, 44, and latch circuits 43, 45 are connected in multiple stages in a ring shape. The tri-state inverter 42 on the output side of the inverter 41 is controlled to be on/off by an inverted signal of the main amplifier driving signal SM, and the tri-state inverter 44 between the two latch circuits 43 and 45 is controlled to be on/off by the main amplifier driving signal SM. Each of the latch circuits 43 and 45 is composed of a pair of inverters connected in parallel in opposite directions to each other. The latch circuit 43 of the previous stage latches output data of the tri-state inverter 42, and the latch circuit 45 of the subsequent stage latches output data of the tri-state inverter 44. The inverter 41 receives a replica signal SR outputted from the latch circuit 45.

In the configuration of FIG. 3, when the main amplifier driving signal SM is "0", the tri-state inverter 42 is turned on and the tri-state inverter 44 becomes high impedance. Thus, the replica signal SR is latched by the latch circuit 43 through the inverter 41 and the tri-state inverter 42. On the other hand, when the main amplifier driving signal SM is "1", the tri-state inverter 42 becomes high impedance, and the tri-state inverter 44 is turned on. Thus, the latch data in the latch circuit 43 is latched by the latch circuit 45 through the tri-state inverter 44. Accordingly, by switching of the main amplifier driving signal SM within one period, the level of the replica signal SR is shifted from "0" to "1" or from "1" to "0".

The driver 31 is composed of a P-type MOS transistor Q3 and an N-type MOS transistor Q4 connected in series between the power supply and ground, similarly as the driver 21 of FIG. 2. The replica signal SR from the replica signal generating circuit 33 is coupled to gates of the MOS transistors Q3 and Q4, and a node between the MOS transistors Q3 and Q4 is connected to an input of the replica data bus RB. By this connection, the replica signal SR inputted to the driver 31 is inverted and transmitted through the replica data bus RB as replica data D2 (the replica signal of the invention). The level of the replica data D2 is shifted in response to a change in the read data D1 transmitted through the data bus DB.

The output buffer 32 is composed of a transfer gate T2 connected to an output of the replica data bus RB. Two control terminals of the transfer gate T2 are connected to the power supply and ground and are controlled to be always in a conductive state. Thus, the replica data D2 transmitted through the replica data bus RB is outputted to the detection circuit 34 through the transfer gate T2.

Figure 4:
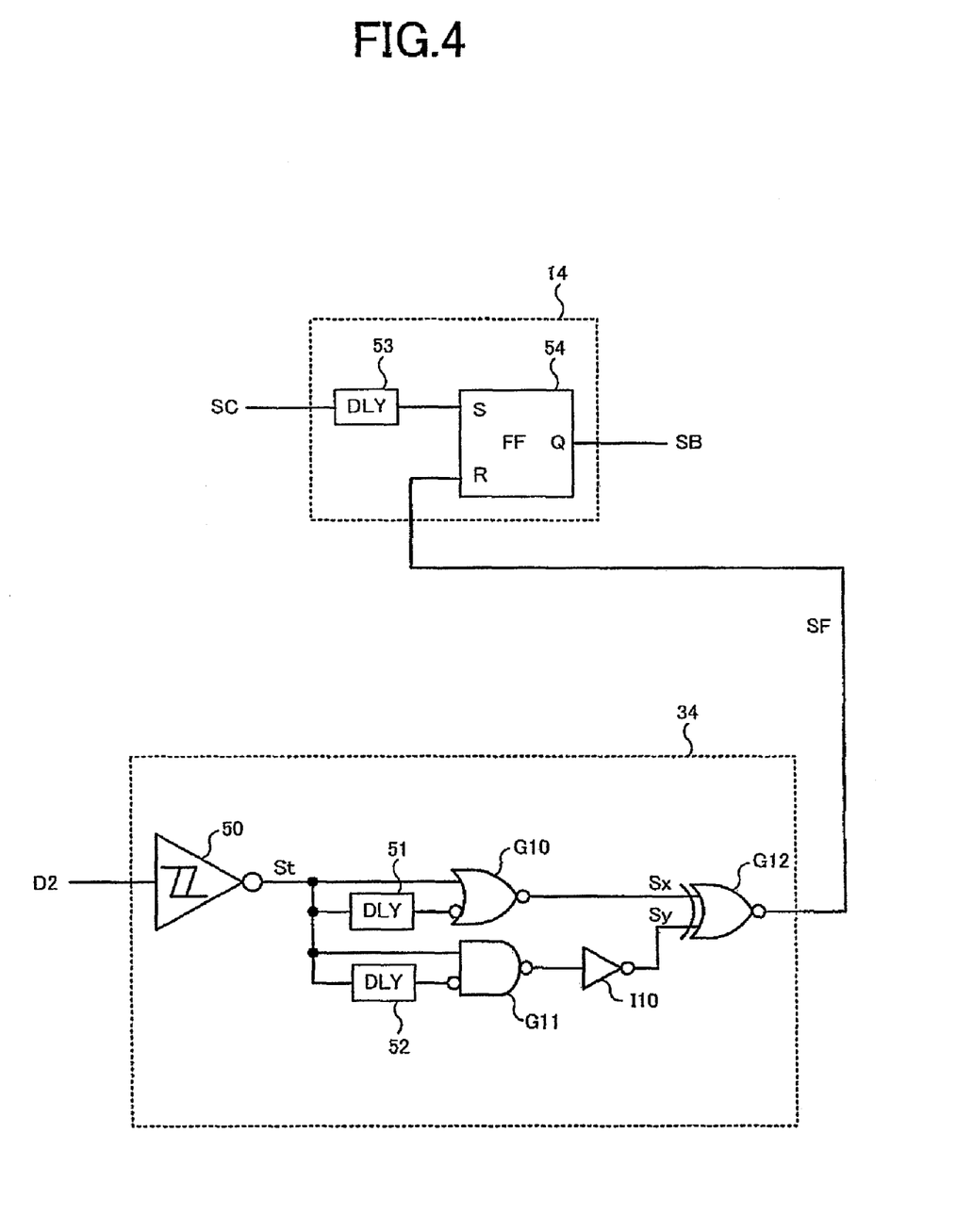
FIG. 4 is a diagram showing a circuit configuration example of a portion including a detection circuit 34 and a bus controller 14 of FIG. 1.

Next, FIG. 4 shows a circuit configuration example of a portion including the detection circuit 34 and the bus controller 14 of FIG. 1. As shown in FIG. 4, the detection circuit 34 is composed of a schmitt trigger inverter 50, delay elements 51, 52, a NOR gate G10, a NAND gate G11, an inverter I10, and an EXOR gate G12. The replica data D2 inputted to the detection circuit 34 has a moderate change in waveform due to transmission characteristics of the replica data bus RB. Thus, the schmitt trigger inverter 50 having hysteresis characteristics shapes and inverts the replica data D2 and outputs a signal St.

The above signal St is inputted to one input terminal of the NOR gate G10, and a signal obtained by delaying the signal St through the delay element 51 is inputted to the other input terminal of the NOR gate G10. The above signal St is inputted to one input terminal of the NAND gate G11, and a signal obtained by delaying the signal St through the delay element 52 is inputted to the other input terminal of the NAND gate G11. A signal Sx outputted from the NOR gate G10 generates a pulse at a timing at which the replica data D2 changes from "0" to "1". Meanwhile, a signal Sy outputted from the NAND gate G11 through the inverter I10 generates a pulse at a timing at which the replica data D2 changes from "1" to "0". Respective pulse widths of the signals Sx and Sy have been properly adjusted based on amount of delays in the delay elements 51 and 52.

Then, the EXOR gate G12 takes an exclusive logical sum of the signals Sx and Sy and outputs it as the feedback signal SF. Accordingly, the feedback signal SF has a pulse generated at a timing at which the replica data D2 is shifted between "0" and "1". In this case, after the pulse of the main amplifier driving signal SM is outputted as described above, the level of the replica data D2 is shifted in response thereto and the pulse of the feedback signal SF is outputted after being delayed by a predetermined time.

Meanwhile, the bus controller 14 is composed of a delay element 53 and a flip-flop 54. The delay element 53 receives the read control signal SC and delays it by a predetermined time, and thereafter the read control signal SC is inputted to a set terminal (S) of the flip-flop 54. Further, the feedback signal SF from the detection circuit 34 is inputted to a reset terminal (R) of the flip-flop 54. The above output control signal SB is outputted from an output terminal (Q) of the flip-flop 54. Thus, the output control signal SB is controlled so that it rises in response to a pulse of the read control signal SC and falls in response to a pulse of the feedback signal SF, as described later.

Figure 5:
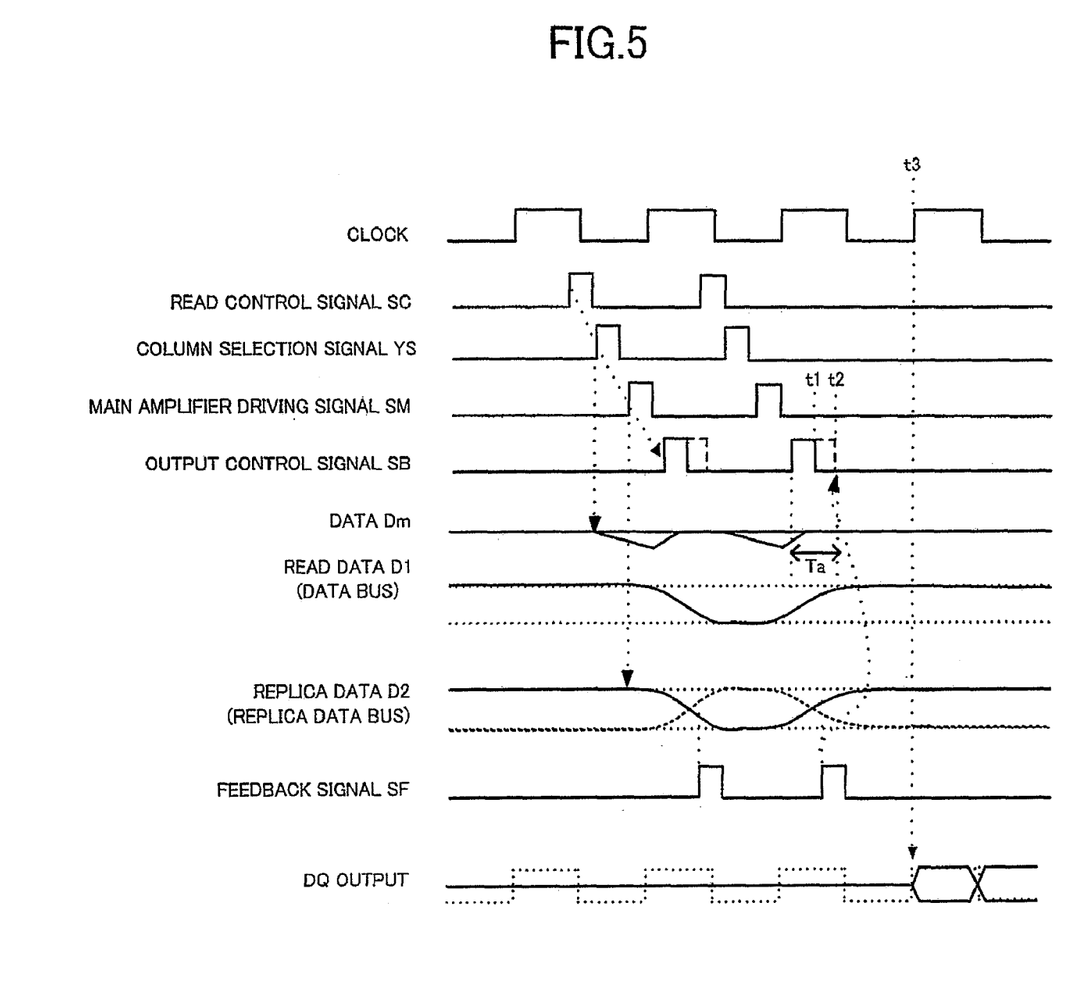
FIG. 5 is a first waveform diagram based on the principal configuration of FIG. 1 in read operation of the DRAM of the embodiment.

Next, the operation of the DRAM of the embodiment will be described with reference to FIGS. 5 and 6. FIG. 5 is a first waveform diagram based on the principal configuration of FIG. 1 in the read operation of the DRAM. A waveform of a clock having a predetermined period, which is used as a reference for operations of respective parts in FIG. 1, is shown in the top part of FIG. 5. When one read operation is controlled to be performed, one pulse of the read control signal SC is outputted associated with the period of the clock, and subsequently one pulse of the column selection signal YS supplied to the memory cell array 10 is outputted.

In FIG. 5, an example is shown where the read control signal SC, the column selection signal YS and the like have a relatively short pulse width in comparison with one period of the clock. This situation can occur due to device fluctuation and temperature fluctuation in the DRAM. Also the main amplifier driving signal SM, the output control signal SB and the feedback signal SF have a short pulse width in the same manner.

Data Dm of a selected memory cell in the memory cell array 10 is read out via a sense amplifier in response to the pulse of the column selection signal YS, and its level gradually changes. Subsequently, the pulse of the main amplifier driving signal SM supplied to the main amplifier 11 is outputted. Thereby, the data Dm is sent to the data bus circuit 20 through the main amplifier 11 and the input circuit 23. At this point, the level of the read data D1 transmitted through the data bus DB is gradually shifted in accordance with transmission characteristics. Meanwhile, since the main amplifier driving signal SM is also supplied to the replica signal generating circuit 33, the replica signal SR is sent to the replica circuit 30 due to the above operation. Then, the level of the replica data D2 transmitted through the replica data bus RB gradually changes. As mentioned above, the level of the replica data D2 is shifted at the same timing as the change in the read data D1.

The above operation is repeated in every period of the clock. In the example of FIG. 5, a case is shown where the read data D1 changes in the order low, high, low, and thus the level of the replica data D2 following the change of the read data D1 is shifted at two points. Then, the detection circuit 34 detects shifting of the level of the replica data D2 and generates the feedback signal SF having a corresponding pulse. The feedback signal SF is fed back to the bus controller 14, and the flip-flop 54 is reset at a predetermined timing. Thereafter, the transfer of the DQ output from the DQ output circuit 16 is started via the latency controller 15 at a rise timing t3 of the clock.

As shown in FIG. 5, the output control signal SB is maintained high at a timing t1 at which it is supposed to fall for the original pulse width, and subsequently the output control signal SB actually falls at a timing t2. The read data D1 transmitted through the data bus DB is unstable at the timing t1 so that it possibly causes a read failure. Corresponding to this, the end of the output term of the data bus DB is controlled to be delayed to the timing t2 at which the read data D1 is stable in the embodiment. Thus, since an extended output term Ta is set for the data bus DB, appropriate margin can be obtained so that the read data D1 can be stably read out.

Figure 6:
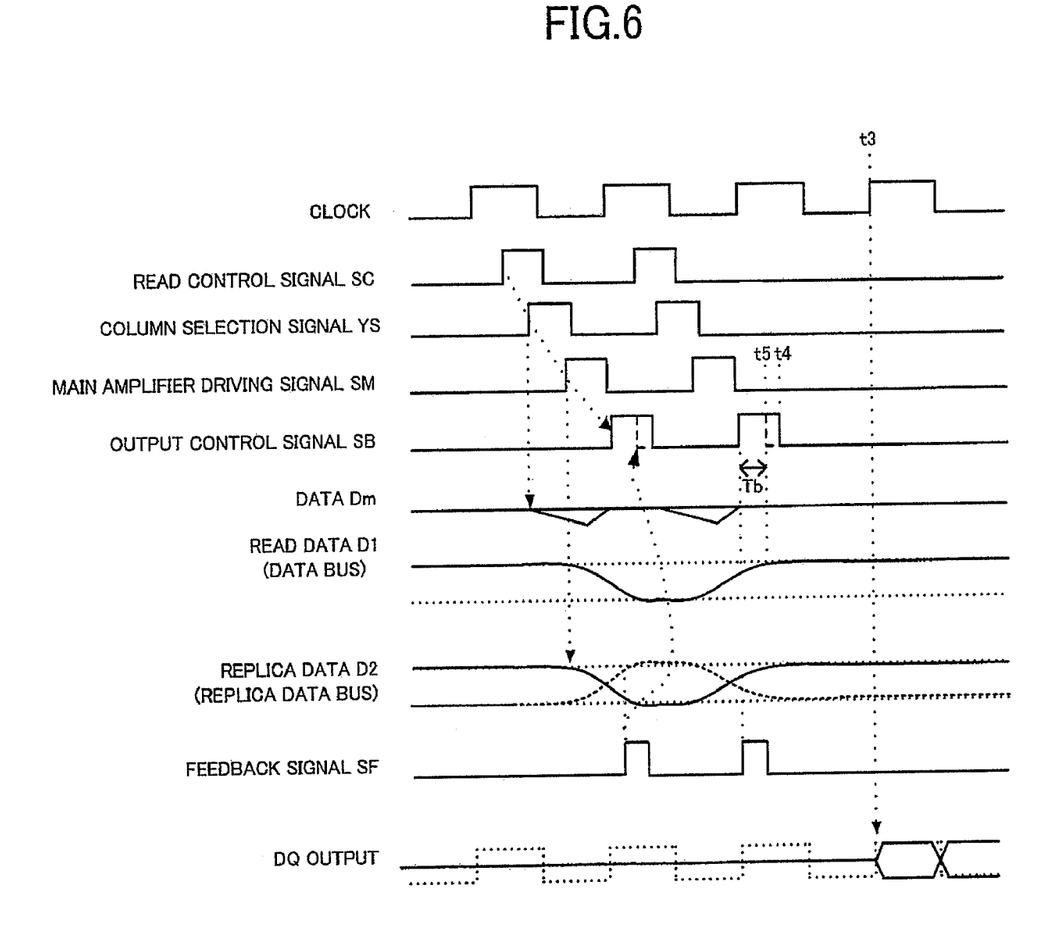
FIG. 6 is a second waveform diagram based on the principal configuration of FIG. 1 in read operation of the DRAM of the embodiment.

Next, FIG. 6 is a second waveform diagram based on the principal configuration of FIG. 1 in the read operation of the DRAM. Respective signals shown in FIG. 6 are the same as those in FIG. 5. However, FIG. 6 shows an example where each signal has a relatively long pulse width in comparison with one period of the clock. That is, a case is assumed where influence due to device fluctuation and temperature fluctuation in the DRAM is opposite to that in FIG. 5.

The read control signal SC, the column selection signal YS and the main amplifier driving signal SM change in the same direction as those in FIG. 5, respectively, however change timings thereof are different from those in FIG. 5. Then, the level of the replica data D2 is shifted in response to a change in the read data D1 according to the above operation, and the feedback signal SF having a corresponding pulse is generated and fed back to the bus controller 14.

In FIG. 6, the output control signal SB falls at a timing t5 before a timing t4 at which it is supposed to fall for the original pulse width, as different from FIG. 5. The timing t4 leads to over-margin for the time required for stabilizing the read data D1 transmitted through the data bus DB. Corresponding to this, the end of the output term of the data bus DB is controlled to be advanced to the timing t5 at which the read data D1 is stable in the embodiment. Thus, since a shortened output term Tb is set for the data bus DB, the over-margin can be avoided so that the read data D1 can be read out at high-speed.

Figure 7:
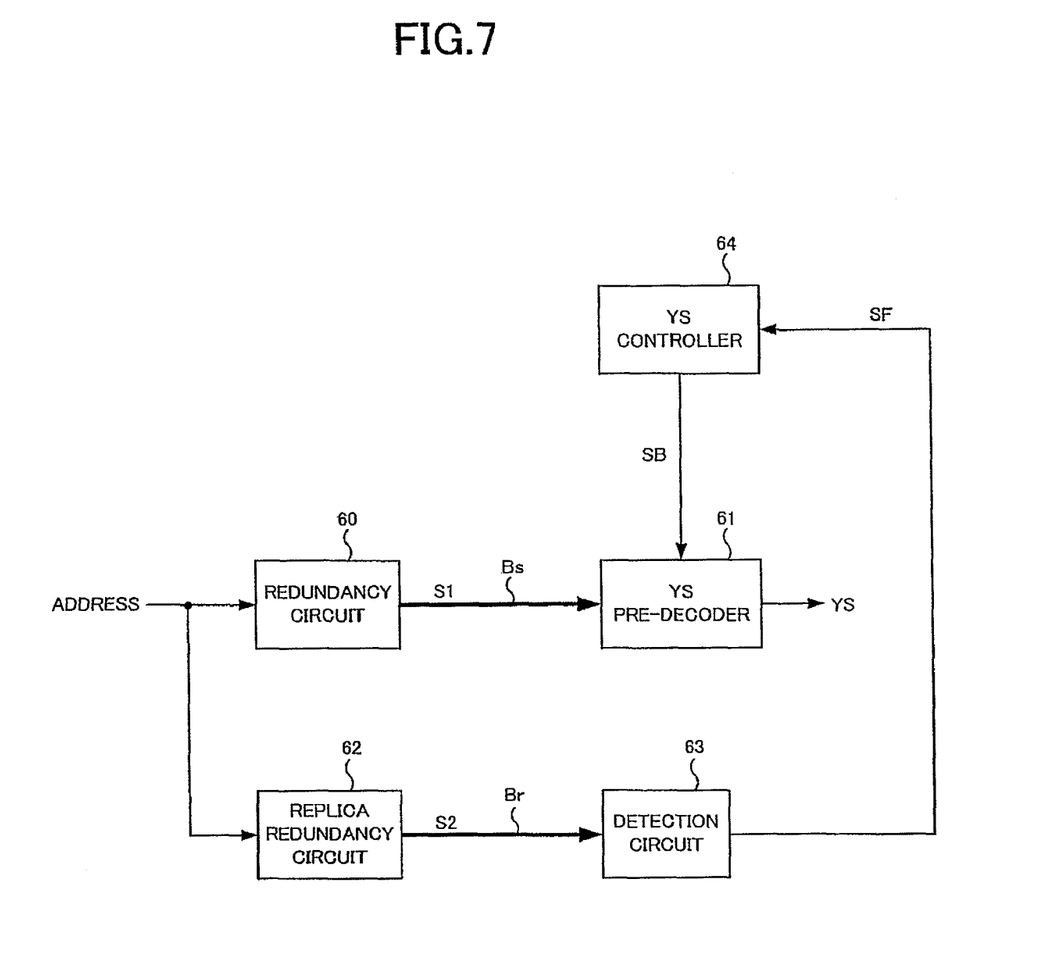
FIG. 7 is a block diagram showing a principal configuration of a DRAM of a modification of the embodiment.

In the above described embodiment, the present invention has been applied to the circuit block relating to the read operation of the DRAM, however the present invention can be also applied to circuit blocks relating to other functions. In the following, a case will be described in which the transmission control circuit of the present invention is configured in a circuit block relating to a column control of the DRAM, as a modification of the embodiment. FIG. 7 is a block diagram showing a principal configuration of the DRAM of this modification. In FIG. 7, there are shown a circuit block relating to the column operation of the DRAM, which includes a redundancy circuit 60, a YS pre-decoder 61, a replica redundancy circuit 62, a detection circuit 63, and a YS controller 64.

In the configuration of FIG. 7, the redundancy circuit 60 is a circuit for compensating for a defect in the memory cell array 10 using a redundant circuit and generates a redundancy hit signal S1 indicating whether or not the defect exists in the memory cell array 10, based on an input address. The redundancy hit signal S1 from the redundancy circuit 60 is transmitted through a signal bus Bs and inputted to the YS pre-decoder 61. The YS pre-decoder 61 generates the column selection signal YS, which is to be supplied to the memory cell array 10, based on the redundancy hit signal S1 received through the signal bus Bs. The output timing of the column selection signal YS in the YS pre-decoder 61 is controlled based on the output control signal SB supplied from the YS controller 64.

Meanwhile, the replica redundancy circuit 62 is configured to operate in the same manner as the redundancy circuit 60, and generates a replica redundancy hit signal S2 whose level changes in response to a change in the above redundancy hit signal S1, based on the input address. The replica redundancy hit signal S2 from the replica redundancy circuit 62 is transmitted through a replica signal bus Br having the same transmission characteristics as the above signal bus Bs and inputted to the detection circuit 63. The detection circuit 63 detects shifting of the level of the replica redundancy hit signal S2 in the same manner as the above detection circuit 34 and outputs the feedback signal SF having a pulse corresponding to the detection result. The feedback signal SF is fed back to the YS controller 64, so that the output timing of the output control signal SB is controlled.

Figure 8:
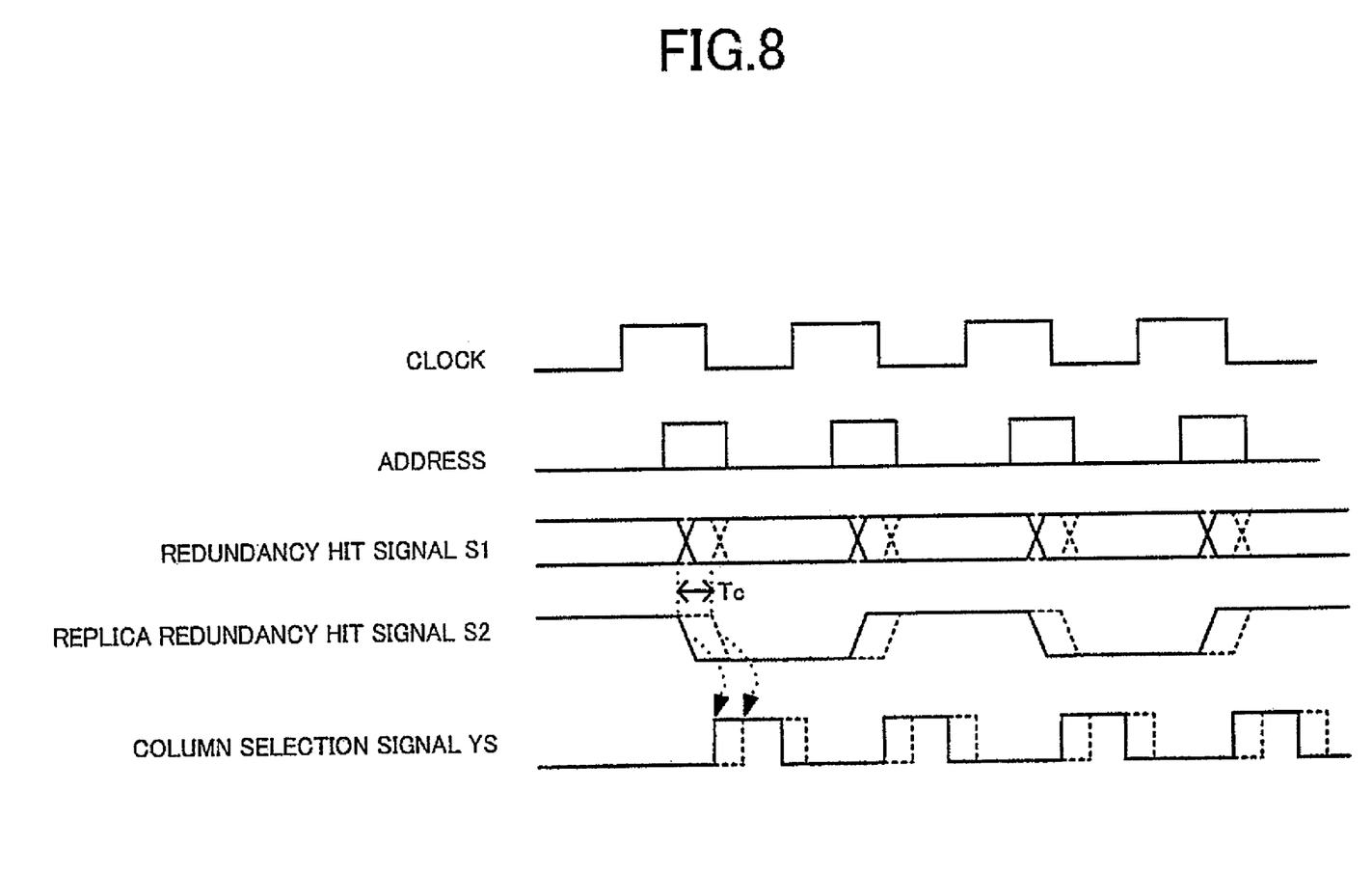
FIG. 8 shows a waveform diagram based on the principal configuration of FIG. 7 in the DRAM operation of the modification of the embodiment.

FIG. 8 shows a waveform diagram based on the principal configuration of FIG. 7 in the DRAM operation of the modification. In the top part of FIG. 8, respective waveforms of a clock having a predetermined period and the address of FIG. 7 are shown. When the address is inputted in each period of the clock, a corresponding redundancy hit signal S1 is generated. The level of the replica redundancy hit signal S2 is alternately shifted between high and low levels in response to a change in the redundancy hit signal S1, and thereafter a corresponding column selection signal YS is outputted. At this point, as shown by dotted lines in FIG. 8, when the output timing of the redundancy hit signal S1 is delayed by a time Tc, corresponding to this, the output timing of the replica redundancy hit signal S2 is delayed by the time Tc. Thus, the output timing of the column control selection YS from the YS predecoder 61 is delayed by the time Tc by the operation of the detection circuit 63 and the YS controller 64, thereby obtaining appropriate margin for the output operation.

As described above, the transmission control circuit of the present invention can be utilized for various purposes. The configurations shown in the above embodiment and its modification are applications to which the transmission control circuit of the present invention is applied, however the present invention can be widely applied to other configurations in which output timing is properly controlled when a predetermined signal is transmitted through a signal bus.

It is apparent that the present invention is not limited to the above embodiments, but may be modified and changed without departing from the scope and spirit of the invention.

What is claimed is:

1. A semiconductor device comprising a transmission control circuit, said transmission control circuit comprising:
   a signal transmission circuit for receiving a predetermined signal in synchronization with a first control signal, transmitting said predetermined signal through a signal bus, and outputting said predetermined signal in synchronization with a second control signal;
   an output control circuit for supplying said second control signal to said signal transmission circuit and controlling an output timing at which said predetermined signal is outputted from said signal bus;
   a replica circuit for transmitting and outputting a replica signal through a replica signal bus having same transmission characteristics as said signal bus, said replica signal being shifted in level in response to an input timing of said predetermined signal based on said first control signal; and
   a detection circuit for detecting shifting between high and low levels of said replica signal outputted from said replica circuit, and supplying a feedback signal indicating a detection result to said output control circuit,
   wherein the output timing of said output control circuit is controlled in accordance with a timing at which the shifting of said replica signal is detected in said feedback signal.

2. The semiconductor device according to claim 1, said transmission control circuit further comprising a replica signal generating circuit for generating said replica signal whose level is shifted in response to the input timing of said predetermined signal, based on said first control signal, and outputting the generated replica signal to said replica circuit.

3. The semiconductor device according to claim 1, wherein said replica signal generating circuit includes a plurality of inverters connected in an odd number of multiple stages in a ring shape, and is controlled to be alternately inverted between 0 and 1 by said first control signal.

4. The semiconductor device according to claim 1,
   wherein said signal transmission circuit includes a drive circuit for driving said signal bus using the predetermined signal and includes an output buffer for controlling transmission of said predetermined signal transmitted through said signal bus in accordance with said second control signal,
   and said replica circuit includes circuits corresponding to said drive circuit and said output buffer.

5. The semiconductor device according to claim 1, wherein said detection circuit includes a schmitt trigger inverter receiving said replica signal from said replica circuit and a logic circuit for generating a pulse at a timing at which an output level of said schmitt trigger inverter is inverted.

6. The semiconductor device according to claim 1, wherein said output control circuit includes a flip-flop reset by said feedback signal.

7. The semiconductor device according to claim 6, wherein said first control signal or a signal for generating said first control signal is inputted to a set terminal of said flip-flop.

8. The semiconductor device according to claim 1, wherein said predetermined signal is read data read out from a memory cell array for storing data.

9. The semiconductor device according to claim 8, wherein said predetermined signal is a redundancy hit signal for compensating for a defective memory cell.

10. The semiconductor device according to claim 9, further comprising a main amplifier for amplifying said read data,
    wherein said main amplifier outputs said read data to said signal transmission circuit in response to a main amplifier driving signal as said first control signal.

11. The semiconductor device according to claim 1,
    wherein said replica signal transmitted through said replica signal bus is a single phase signal,
    and said detection circuit includes a first detection unit for detecting a first shifting corresponding to a change in signal level of said replica signal bus and a second detection unit for detecting a second shifting reverse to said first shifting of said replica signal bus, and generates said feedback signal by logic synthesis of respective outputs of said first and second detection units.

12. A semiconductor device comprising:
    a signal transmission circuit including a signal bus, an input circuit for said signal bus, and an output circuit for said signal bus;
    a replica signal bus having same transmission characteristics as said signal bus; and
    a replica circuit including said replica signal bus, an input circuit for said replica signal bus, and an output circuit for said replica signal bus,
    wherein a predetermined signal is transmitted through said signal bus and a replica signal is transmitted through said replica signal bus, based on said first control signal,
    said replica circuit receives said replica signal and outputs a feedback signal,
    and the output circuit of said signal transmission circuit controls transmission of the signal through said signal bus in accordance with a second control signal generated from said feedback signal.

13. The semiconductor device according to claim 12, wherein said replica signal generating circuit includes a plurality of inverters.

14. The semiconductor device according to claim 12, wherein said replica signal is a single phase signal, and said feedback signal is outputted from a detection circuit for detecting a first shifting in signal level of said replica signal and a second shifting thereof reverse to said first shifting.

15. The semiconductor device according to claim 14, wherein said detection circuit includes a schmitt trigger circuit for detecting an output signal of said replica circuit.

16. The semiconductor device according to claim 12 further comprising a main amplifier for amplifying read data read out from a memory cell array, wherein said signal transmission circuit is connected to an output of said main amplifier, and an output circuit connected to an output terminal is connected to an output of said signal transmission circuit.

17. The semiconductor device according to claim 12 further comprising:

a redundancy circuit receiving an address for selecting a memory cell of a memory cell array and determining a defective memory cell based on the input address; and a decoder for generating a decode signal for selecting said defective memory cell, wherein an output of said redundancy circuit is connected to said signal transmission circuit, and an output of said signal transmission circuit is connected to said decoder.

18. The semiconductor device according to claim 12, wherein a length of said signal bus corresponds to a side of the semiconductor device in one direction or another direction perpendicular thereto.

19. The semiconductor device according to claim 12, wherein the input and output circuits of said replica circuit has same delay characteristics as the input and output circuits of said signal transmission circuit.

20. The semiconductor device according to claim 12, further comprising a logic circuit having a set terminal receiving a control signal and a reset terminal receiving said feedback signal.

* * * * *